United States Patent
Prall et al.

(10) Patent No.: US 6,597,054 B1
(45) Date of Patent: Jul. 22, 2003

(54) REDUCED PITCH LASER REDUNDANCY FUSE BANK STRUCTURE

(75) Inventors: Kirk Prall, Boise, ID (US); Tod S. Stone, Boise, ID (US); Paul S. Zagar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/140,498

(22) Filed: Aug. 27, 1998

Related U.S. Application Data

(60) Continuation of application No. 09/031,938, filed on Feb. 27, 1998, now Pat. No. 5,905,295, which is a continuation of application No. 08/831,389, filed on Apr. 1, 1997, now Pat. No. 5,747,869, which is a division of application No. 08/577,468, filed on Dec. 22, 1995, now Pat. No. 5,636,172.

(51) Int. Cl.⁷ .............................................. H01L 29/00
(52) U.S. Cl. ..................... 257/529; 257/209; 257/528; 257/530; 257/665; 365/225.7
(58) Field of Search ................................. 257/529, 209, 257/528, 530, 665; 365/225.7

(56) References Cited

U.S. PATENT DOCUMENTS

| | | | |
|---|---|---|---|
| 5,200,652 A | 4/1993 | Lee | 307/465 |
| 5,264,725 A | 11/1993 | Mullarkey et al. | 257/665 |
| 5,281,868 A | 1/1994 | Morgan | 307/441 |
| 5,424,672 A | 6/1995 | Cowles et al. | 327/525 |
| 5,608,257 A * | 3/1997 | Lee et al. | 257/529 |
| 5,636,172 A * | 6/1997 | Prall et al. | 365/225.7 |
| 5,747,869 A * | 5/1998 | Prall et al. | 257/529 |
| 5,808,351 A * | 9/1998 | Nathan et al. | 257/528 |
| 5,905,295 A * | 5/1999 | Prall et al. | 257/529 |

FOREIGN PATENT DOCUMENTS

| | | | | |
|---|---|---|---|---|
| EP | 0720229 | | 7/1996 | |
| JP | 59151454 | | 8/1984 | |
| JP | 61128544 | | 6/1986 | |
| JP | 61-128544 | | 6/1986 | H01L/21/82 |
| JP | 05251563 | | 9/1993 | |
| JP | 5-251563 | | 9/1993 | H01L/21/82 |
| JP | 6-252268 | | 9/1994 | H01L/21/82 |
| JP | 06252268 | * | 9/1994 | 257/665 |
| JP | 06310603 | | 11/1994 | |
| JP | 6-310603 | | 11/1994 | H01L/21/82 |

* cited by examiner

*Primary Examiner*—Eddie Lee
*Assistant Examiner*—Eugene Lee
(74) *Attorney, Agent, or Firm*—Schwegman, Lundberg, Woessner & Kluth, P.A.

(57) ABSTRACT

A configuration for a laser fuse bank is disclosed wherein the available space is more efficiently used. Fuses of graduated width and variable configuration are placed so as to minimize the average distance between fuses and maximize fuse density. Alternatively, a common source is added to a standard laser fuse structure such that it intersects the fuses and the number of available fuses is doubled.

23 Claims, 3 Drawing Sheets

REDUCED PITCH LASER REDUNDANCY FUSE BANK STRUCTURE

This application is a continuation of U.S. Ser. No. 09/031,938, filed Feb. 27, 1998, now U.S. Pat. No. 5,905,295, which is a continuation of Ser. No. 08/831,389 filed Apr. 1, 1997 now U.S. Pat. No. 5,747,869, issued May 5, 1998, which is a divisional of 08/577,468 filed Dec. 22, 1995 now U.S. Pat. No. 5,636,172, issued Jun. 3, 1997.

TECHNICAL FIELD OF THE INVENTION

The present invention relates generally to integrated circuits and in particular to a fuse bank structure used in integrated circuits.

BACKGROUND OF THE INVENTION

An integrated circuit is a complete electronic circuit, containing transistors, diodes, resistors, and capacitors, along with their interconnecting electrical conductors, contained entirely within a single chip of silicon. Integrated circuits continue to decrease in size, and the circuits they contain continue to increase in complexity. This increases the opportunity for defective chips resulting from a failed element or a defective conductor. The complexity of these devices and the need to interconnect the circuits create very narrow performance tolerances. One way these needs have been met is to manufacture fuses into the device. Fuses can be opened to isolate defective areas and allow the rest of the circuit to be used. Fuses can also be used to trim a circuit, enable a particular mode, or enable or disable different segments of the circuit. By using fuses integrated circuit manufacturers are able to reduce the amount of semiconductor scrap. The continuous drive to reduce the overall size of integrated circuits creates a need to design fuses and other elements of integrated circuits in such a way as to minimize the space they require.

Another way to reduce semiconductor scrap is to provide redundant elements on integrated circuits. If a primary element is defective a redundant element can be substituted for that defective element. One example of an integrated circuit device which uses redundant elements is electronic memory. Typical memory circuits comprise millions of equivalent memory cells arranged in addressable rows and columns. By providing redundant elements, defective memory cells can be replaced. Because the individual primary memory cells of a memory are separately addressable, replacing a defective cell typically comprises opening fuse-type circuits to 'program' a redundant cell to respond to the address of the defective primary cell. This process is very effective for permanently replacing defective primary memory cells.

Circuit designers continuously strive to achieve higher population capacities without a corresponding increase in physical size. Reducing the size of individual elements in integrated circuits is one way in which available die real estate is maximized. For example, as memory density increases the number of laser fuses needed for redundancy in a given memory device also increases. A 256M DRAM is expected to have more than 10,000 laser fuses. Most components of the memory devices can be scaled to meet the space restrictions resulting from the higher densities. However, laser fuses used to implement redundancy can not be scaled due to mechanical restrictions related to current laser technology. Fuse width must be kept large enough to cover the laser spot so that the fuse can absorb a large quantity of heat. In addition, the fuse-to-fuse space must be kept large enough to allow for mechanical laser alignment tolerances and to prevent unintentional programming of a fuse adjacent to an exploding fuse. These laser alignment tolerances, as well as the requirements for a large passivation opening, limit the length of the fuse. Currently the constraints dictated by the laser repair requirements limit the fuse pitch to about 3 microns. The demand for increasing numbers of fuses combined with the fixed pitch limitation create a need for improvements in the laser fuses.

For the reasons stated above, and for other reasons stated below which will become apparent to those skilled in the art upon reading and understanding the present specification, there is a need in the art for a design which provides an increased density of laser fuses.

SUMMARY OF THE INVENTION

The above mentioned problems with increasing the number of fuses in a memory device are addressed by the present invention which will be understood by reading and studying the following specification. A design embodying a more efficient fuse shape is described which allows placement of more fuses in the same amount of physical space.

According to one embodiment of the present invention, an integrated circuit laser fuse system is provided, comprising a plurality of laser fuse banks. Each laser fuse bank comprises three fuses. One of the fuses is a center fuse having a narrow end, a wide end, and a common center line. Another of the fuses is a first outer fuse having a narrow end and a wide end, located adjacent to the center fuse such that the narrow end of the first outer fuse is adjacent to the narrow end of the center fuse and the wide end of the first outer fuse is adjacent to the wide end of the center fuse, the wide end of the first outer fuse is laterally offset from the narrow end of the first outer fuse. Another fuse of the fuse bank is a second outer fuse having a narrow end and a wide end, located adjacent to the center fuse and on the side of the center fuse opposite the first outer fuse such that the narrow end of the second outer fuse is adjacent to the narrow end of the center fuse and the wide end of the second outer fuse is adjacent to the wide end of the center fuse, and the wide end of the second outer fuse is laterally offset from the narrow end of the second outer fuse.

In one embodiment of the present invention the wide end of the first outer fuse is laterally offset from its narrow end in an outwardly direction away from the center fuse and the wide end of the second outer fuse is laterally offset from its narrow end in an outwardly direction away from the center fuse. In another embodiment the plurality of laser fuse banks comprise a first laser fuse bank and a second laser fuse bank positioned such that the second laser fuse bank is adjacent to the first laser fuse bank, and the second laser fuse bank is rotated one hundred eighty (180) degrees from the first laser fuse bank. In yet another embodiment the plurality of laser fuse banks are polysilicon fabricated on an integrated circuit.

According to another embodiment of the present invention the plurality of laser fuse banks are fabricated in a dynamic random access memory (DRAM). The DRAM comprises, in addition to the laser fuse banks, a plurality of primary memory cells and a plurality of redundant memory cells. The DRAM further includes a redundant enable circuit comprising a latch circuit coupled to one of the fuses of the plurality of laser fuse banks and a comparator circuit connected to the latch circuit and a plurality of external address inputs.

Yet another embodiment of the invention is an integrated circuit memory comprising an array of primary memory cells arranged in rows and columns, a plurality of redundant memory cells, and a plurality of laser fuse banks.

In yet another embodiment of the present invention, an integrated laser fuse system is provided, comprising a plurality of substantially straight laser fuses, each one of the plurality of substantially straight laser fuses being located adjacent to and parallel with remaining ones of the plurality of substantially straight laser fuses, and a common ground connection interconnecting the midpoints of the plurality of laser fuses. In yet another embodiment the plurality of laser fuse banks are polysilicon fabricated on an integrated circuit. According to another embodiment of the present invention the integrated laser fuse system is fabricated in a dynamic random access memory (DRAM) comprising the laser fuse system, a plurality of primary memory cells, a plurality of redundant memory cells, a redundant enable circuit comprising a latch circuit coupled to one of the fuses of the integrated laser fuse system, and, a comparator circuit connected to the latch circuit and a plurality of external address inputs. Another embodiment of the invention is an integrated circuit memory comprising an array of primary memory cells arranged in rows and columns, a plurality of redundant memory cells, and the integrated laser fuse system.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

It will be understood that the following description of a DRAM is intended to provide a general understanding of the memory and is not a complete description of all the elements and features of a DRAM. Further, the present invention is equally applicable to any size and type of integrated circuit, including programmable logic, microprocessors, and memories, and is not intended to be limited to the DRAM described below.

Figure 1A:
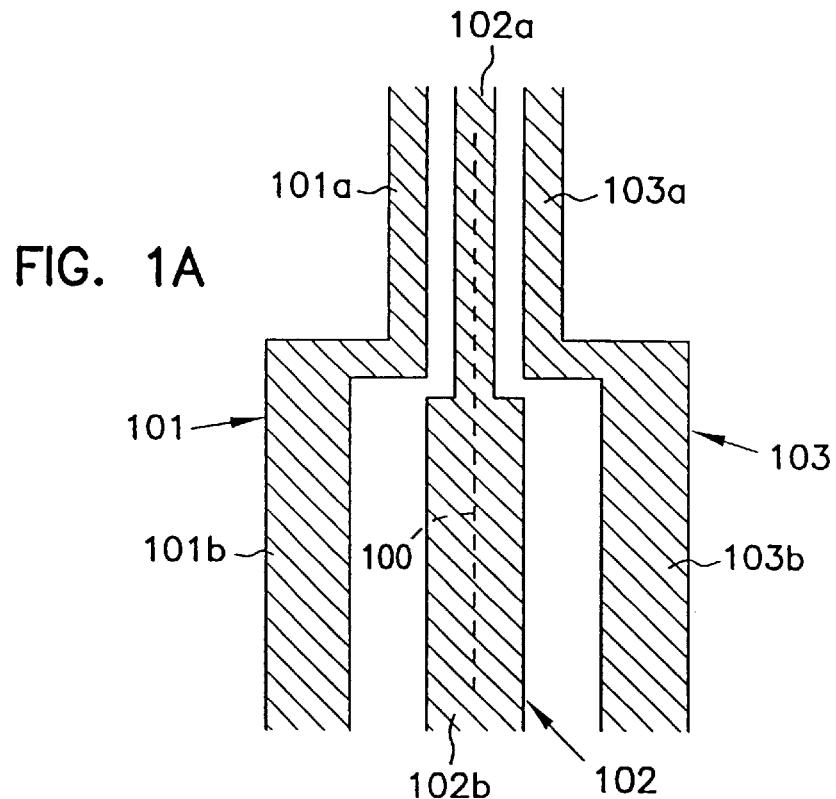
FIG. 1A is a block diagram of an integrated circuit laser fuse bank as disclosed in one embodiment of the present invention.

One embodiment of the invention describes a pattern for efficient placement of fuses and is illustrated in FIG. 1A. Shown is a fuse set comprised of three fuses, hereinafter the left fuse 101, the central fuse 102, and the right fuse 103. Each fuse has a narrow section 101a, 102a, 103a and a wide section 101b, 102b, 103b. In this embodiment the size and spacing of the narrow sections are set by the minimum spacing and conductor design rules, and the wider sections by the laser fuse spacing and width design rules. The central fuse is comprised of a narrow and a wide section 102a, 102b which are connected end-to-end and have a common center line 100. The wide section of the left and right fuses 101b, 103b are connected to the narrow section of the respective fuses 101a, 103a, but are laterally offset from the narrow section a distance determined by laser fuse spacing rules.

Figure 1B:
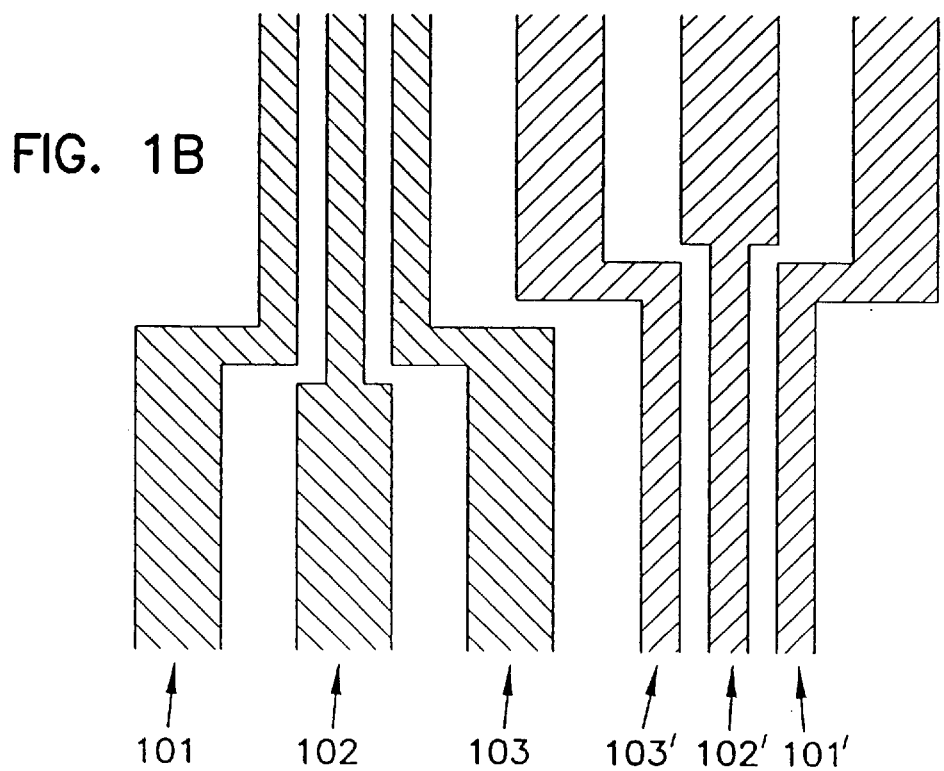
FIG. 1B is a block diagram showing the relative positioning of a plurality of integrated circuit laser fuse banks as disclosed in one embodiment of the invention.

A fuse set is created by placing a left fuse, a central fuse, and a right fuse laterally parallel such that the narrow sections 101a, 102a, 103a are adjacent and separated by the distance specified in the minimum spacing and conductor design rules. In one embodiment the minimum spacing and conductor design rules specify a pitch of $1.25\mu$ and a width of $0.5\mu$. The wide sections 101b, 102b, 103b are adjacent and separated by the distance specified in the laser fuse spacing and width design rules. FIG. 1B shows how each succeeding fuse set is rotated 180° and placed laterally parallel to the preceding fuse set such that the adjacent fuses of each set 103, 103' are separated by the distance specified by the laser fuse spacing and width design rules. This pattern is repeated to fill the available physical space. The fuses described in this embodiment are preferably constructed of polysilicon, fabricated on the top surface of an integrated circuit, and are programmed or "opened" by using a laser to evaporate a portion of the polysilicon. The fuse, therefore, normally has a conductive path from one end to the other. By removing a portion of the fuse, the conductive path can be opened.

Figure 2:
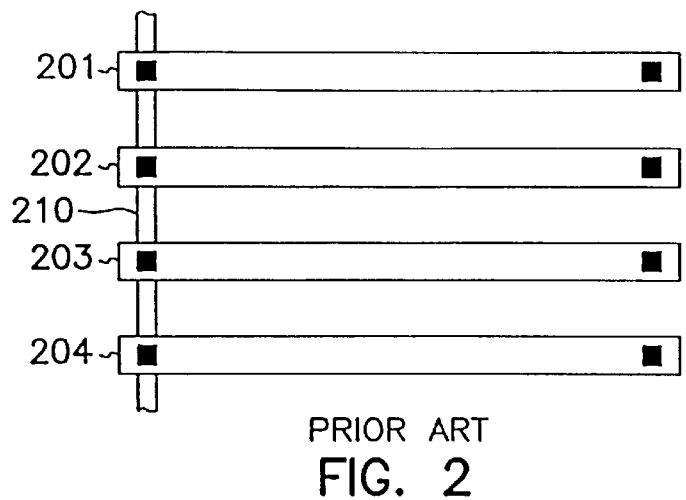
FIG. 2 is block diagram of a laser fuse bank as known in the art.
Figure 3:
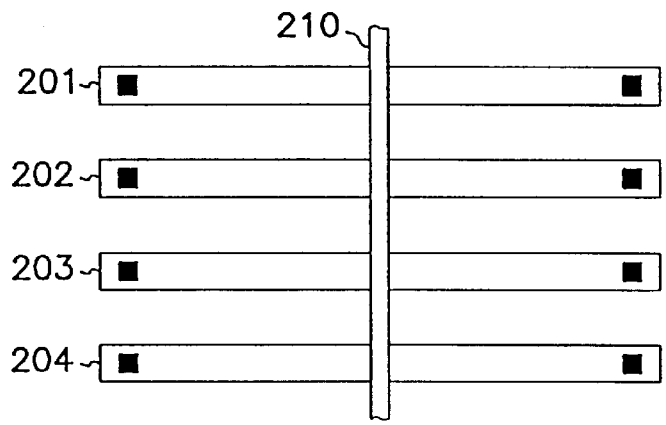
FIG. 3 is a block diagram of a common source laser fuse bank as disclosed in one embodiment of the present invention.

Another embodiment of the invention is a fuse structure incorporating a common source. FIG. 2 shows the conventional method wherein uniform-width fuses 201–204 are positioned parallel to one another using the laser fuse spacing and width design rules. There is a common ground 210 on one end of the fuses. The other end of each fuse is connected to a fuse circuit, an example of which is discussed below. FIG. 3 illustrates the positioning, according to the present invention, of a common ground 210 perpendicular to the uniform-width fuses 201–204 and intersecting each of the fuses at their midpoint. Both ends of each fuse are connected to a fuse circuit. As can be seen, implementation of this embodiment doubles the number of available fuses without increasing the space requirements.

Figure 4:
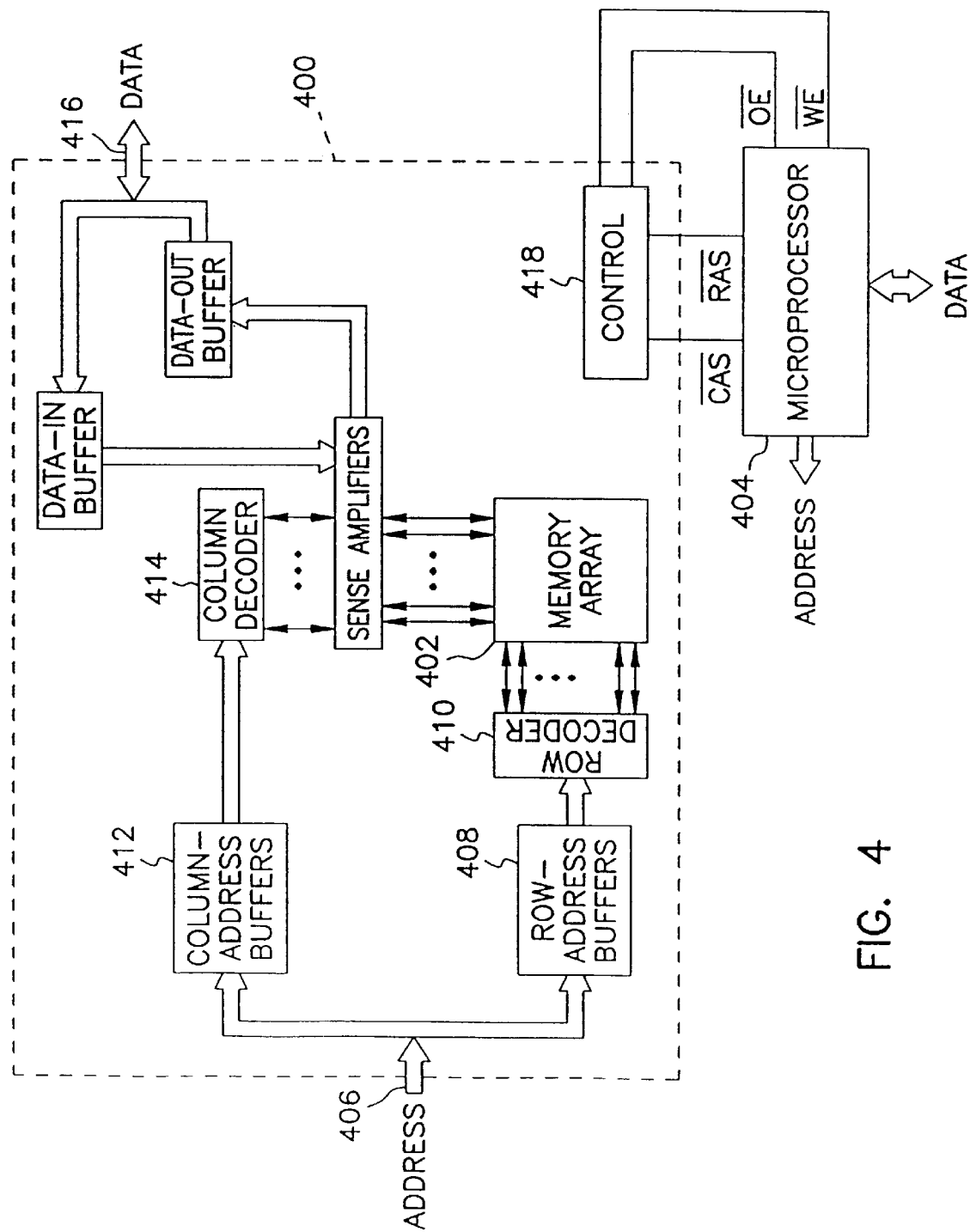
FIG. 4 is block diagram of a conventional DRAM device.

One example of how a semiconductor device employs fuses such as those disclosed by the invention is shown in FIG. 4. The DRAM 400 of FIG. 4 includes a DRAM array 402 which can be accessed by a microprocessor 404 through input/output connections including address lines 406. The DRAM array includes rows and columns of randomly addressable memory registers. The DRAM is accessed through address bus 406, row and column address strobe signals RAS* and CAS*, write enable signal WE*, an output enable signal OE* and by using other conventional control signals (not shown) which are known to one skilled in the art. Row address latch/buffer 408 and row decoder 410 receive and decode a row address from a row address signal provided on address lines, and address a corresponding row of the DRAM array. Likewise, column address latch/buffer 412 and column decoder 414 receive and decode a column address from a column address signal provided on address lines, and address the corresponding column of the DRAM array.

Data bus 416 receives memory register data during a write cycle from the microprocessor for writing to DRAM array. Data stored in the DRAM can be transferred during a read cycle on bus 416. Control logic 418 is used to control the many available functions of the DRAM. Various control circuits and signals not detailed herein initiate and synchronize the DRAM operation as known to those skilled in the art. Control circuitry 418 can include redundant memory element enable circuits, That is, the memory array includes both primary and redundant memory cells. If a primary memory cell is determined to be defective, a redundant memory cell can be programmed to function in place of the defective primary cell. The control circuit 418, therefore, controls both row decoder 410 and column decoder 414 such that the proper memory cell is addressed.

Some of the inputs and outputs of DRAM 400 used to communicate with microprocessor 404 are described as follows. Write enable input (WE*) is used to select a read or write cycle when accessing the DRAM. To read the DRAM array, the WE* line is high when CAS* falls. If the WE* line is low when CAS* falls, the DRAM is written to. Row address strobe (RAS*) input is used to clock in the nine row address bits and strobe for WE* CAS*, and DQ. In standard memories, the RAS* also acts as the master chip enable and must fall for the initiation of any DRAM array or transfer operation. Column address strobe (CAS*) input is used to clock in the nine column address bits.

Address input lines are used to identify a row and column address to select at least one memory cell out of the available memory cells of DRAM array 402. DRAM data input/output lines 416 provide data input and output for the DRAM array. As stated above, the DRAM description has been simplified for purposes of illustrating the present invention and is not intended to be a complete description of all the features of a DRAM.

Figure 5:
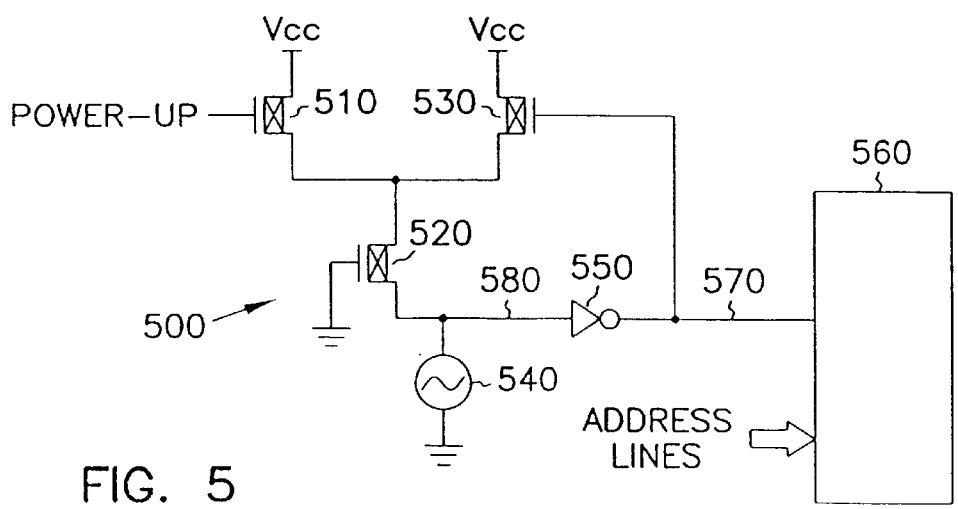
FIG. 5 is block diagram of a conventional fuse circuit.

One example of how a fuse circuit is employed in an electronic memory is illustrated in FIG. 5. Redundant enable circuit 500 is typically included in a memory, such as the DRAM described above. The redundant enable circuit can be included in control circuit 418 to access a redundant memory cell when an address of a defective primary cell is received on address lines 406. A comparator 560 is used to compare each address line to reference line 570. Although only one reference line is illustrated, it will be understood that in a preferred embodiment each address line has a corresponding reference line. Further, a redundant enable circuit 500 is provided for each redundant memory cell included in the memory array.

To enable a redundant memory cell, fuse 540 is programmed, as described above, so that the reference line 570 matches the address of a defective memory cell. That is, fuse 540 normally has a conductive path from one end to the other. The input to inverter 550, therefore, is low and its output 570 is high. When the fuse is programmed, the input to inverter can float unless latched to a proper voltage. To "read" the state of the fuse and latch the input of the inverter transistors 510, 520 and 530 are provided. Providing a low signal to the gate of transistor 510 during the memory circuit power-up sequence, transistor 510 is activated and the source of transistor 520 is pulsed high to VCC. If fuse 540 is unprogrammed then line 580 is pulled low. Conversely, if fuse 540 is programmed the input to inverter 550 is pulled high through transistor 520. The gate of transistor 530 is pulled low with the output of inverter 550, which turns on transistor 530, thereby latching the input of inverter 550 high. It will be understood that many different circuits can be used to enable redundant memory elements and the present invention is not limited to the circuit described herein. Further, integrated circuits, including memories, can use the fuses of the present invention for any application where fuses may be needed.

Conclusion

A spatially optimized laser fuse bank has been described for use in an integrated circuit. The pattern of fuses is used to increase the maximum number of fuses in integrated circuits, thereby allowing an increase in the density of devices included in the circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A laser fuse system for an integrated circuit, comprising:
   a first fuse having a narrow region and a wide region; and
   a second fuse having a narrow region and a wide region, the second fuse positioned adjacent the first fuse such that the narrow region of the second fuse is adjacent the narrow region of the first fuse and the wide region of the second fuse is adjacent the wide region of the first fuse, with the wide region of the second fuse laterally offset from the narrow region of the second fuse.

2. The fuse system of claim 1 further comprising:
   a third fuse having a third narrow region and a third wide region, the third fuse positioned adjacent the first fuse and opposite the second fuse such that the third narrow region is adjacent the first narrow region and the third wide region is adjacent the first wide region, and the third wide region is laterally offset from the third narrow region.

3. The fuse system of claim 2 further comprising:
   a fourth fuse having a fourth narrow region and a fourth wide region, the fourth fuse positioned adjacent the third fuse and opposite the first fuse such that the fourth narrow region is adjacent the third wide region and the fourth wide region is adjacent the third narrow region, and the third wide region is laterally offset from the third narrow region.

4. A laser fuse system for an integrated circuit, comprising:
   a first fuse having a narrow region and a wide region;
   a second fuse having a narrow region and a wide region, the second fuse positioned adjacent the first fuse such that the narrow region of the second fuse is adjacent the narrow region of the first fuse and the wide region of the second fuse is adjacent the wide region of the first fuse, with the wide region of the second fuse laterally offset from the narrow region of the second fuse;
   a third fuse having a third narrow region and a third wide region, the third fuse positioned adjacent the first fuse and opposite the second fuse such that the third narrow region is adjacent the first narrow region and the third wide region is adjacent the first wide region, and the third wide region is laterally offset from the third narrow region; and
   a fourth fuse having a fourth narrow region and a fourth wide region, the fourth fuse positioned adjacent the third fuse and opposite the first fuse such that the fourth narrow region is adjacent the third wide region and the fourth wide region is adjacent the third narrow region, and the third wide region is laterally offset from the third narrow region.

5. A laser fuse system comprising:
a first laser fuse bank having a wide section and a narrow section; and
a second laser fuse bank having:
   a wide section positioned next to the narrow section of the first laser fuse bank; and and
   a narrow section positioned next to the wide section of the first laser fuse bank;
wherein the first and second fuse banks each comprise:
   a first fuse having first narrow and wide regions which have a common centerline;
   a second fuse having a second narrow region next to the first narrow region and having a second wide region next to the first wide region, with the second wide region laterally offset from the second narrow region; and
   a third fuse having a third narrow region and a third wide region, the third fuse positioned next to the first fuse and opposite the second fuse such that the third narrow region is next to the first narrow region and the third wide region is next to the first wide region, and the third wide region is laterally offset from the third narrow region, with the first, second, and third fuses comprising polysilicon.

6. The laser fuse system of claim 5, wherein the first and second fuse banks are each symmetric.

7. A laser fuse system comprising:
a first fuse having laterally offset narrow and wide regions; and
a second fuse having laterally offset narrow and wide regions, with the narrow region of the second fuse next to the wide region of the first fuse and with the wide region of the second fuse next to the narrow region of the first fuse, and with the first and second fuses comprising polysilicon.

8. The fuse system of claim 7 further comprising:
a third fuse having a narrow and a wide region which share a common center line, with its wide region next to the wide region of the second fuse and its narrow region next to the narrow region of the second fuse.

9. A laser fuse system for an integrated circuit, comprising:
a first fuse having first narrow and wide regions; and
a second fuse having second narrow and wide regions, with the second narrow region next to the first wide region and with the second wide region next to the first narrow region, and with the first and second fuses comprising polysilicon.

10. The laser fuse system of claim 9, wherein the first narrow region has a center line and the first wide region is laterally offset from the center line.

11. The fuse system of claim 9, wherein the second wide region is spaced from the first wide region according to laser alignment tolerances.

12. The fuse system of claim 9 further comprising:
a third fuse having third narrow and wide regions which have a common center line, with the third wide region next to the second wide region and with the third narrow region next to the second narrow region.

13. The fuse system of claim 9 wherein the second narrow region is spaced from the first narrow region according to minimum conductor layout rules for the integrated circuit.

14. A laser fuse system comprising:
first fuse means for providing a programmable electrical connection; and
second fuse means for providing a programmable electrical connection, the second fuse positioned adjacent the first fuse means such that a narrow portion of the second fuse means is adjacent a narrow portion of the first fuse means and a wide portion of the second fuse means is adjacent a wide portion of the first fuse means and laterally offset from the narrow portion of the second fuse means.

15. An integrated circuit comprising the laser fuse system of claim 14.

16. A laser fuse system comprising:
first fuse means, having first narrow and wide portions, for providing a programmable electrical connection;
second fuse means having second narrow and wide portions, for providing a programmable electrical connection, the second fuse means positioned adjacent the first fuse means such that the second narrow portion is adjacent the first narrow portion and the second wide portion is adjacent the first wide portion; and
third fuse means, having third narrow and wide portions for providing a programmable electrical connection, the third fuse means positioned adjacent the first fuse means and opposite the second fuse means such that the third narrow portion is adjacent the first narrow portion and the third wide portion is adjacent the first wide portion.

17. An integrated circuit comprising the laser fuse system of claim 16.

18. A laser fuse system comprising:
a first polysilicon fuse having a narrow region and a wide region;
a second polysilicon fuse having a narrow region and a wide region, the second fuse positioned adjacent the first fuse such that the narrow region of the second fuse is adjacent the narrow region of the first fuse and the wide region of the second fuse is adjacent the wide region of the first fuse, with the wide region of the second fuse laterally offset from the narrow region of the second fuse;
a third polysilicon fuse having a third narrow region and a third wide region, the third fuse positioned adjacent the first fuse and opposite the second fuse such that the third narrow region is adjacent the first narrow region and the third wide region is adjacent the first wide region, and the third wide region is laterally offset from the third narrow region; and
a fourth polysilicon fuse having a fourth narrow region and a fourth wide region, the fourth fuse positioned adjacent the third fuse and opposite the first fuse such that the fourth narrow region is adjacent the third wide region and the fourth wide region is adjacent the third narrow region, and the third wide region is laterally offset from the third narrow region.

19. An integrated circuit comprising the laser fuse system of claim 18.

20. A laser fuse system comprising:
first laser fuse bank means for providing a first plurality of programmable electrical connections, the first laser fuse bank means having a wide section and a narrow section; and
second laser fuse bank means for providing a second plurality programmable electrical connections, the second laser fuse bank means having:

a wide section positioned next to the narrow section of the first laser fuse bank means; and a narrow section positioned next to the wide section of the first laser fuse bank means;

wherein the first and second fuse bank means each comprise first, second, and third polysilicon fuses.

21. An integrated circuit comprising the laser fuse system of claim 20.

22. A laser fuse system comprising:

a first fuse having laterally offset means for providing a programmable electrical connection; and a second fuse having laterally offset means for providing a programmable electrical connection, with the second fuse positioned adjacent the first fuse.

23. An integrated circuit comprising the laser fuse system of claim 22.

* * * * *

UNITED STATES PATENT AND TRADEMARK OFFICE
CERTIFICATE OF CORRECTION

PATENT NO. : 6,597,054 B1
DATED : July 22, 2003
INVENTOR(S) : Paul S. Zagar, Kirk D. Prall and Tod S. Stone It is certified that error appears in the above-identified patent and that said Letters Patent is hereby corrected as shown below:

Column 5,
Line 9, delete "," after "circuits" and insert -- . -- therefor.

Column 6,
Line 55, delete "of the first fuse" after "region".
Lines 55 and 57, insert -- second -- before "wide".
Lines 55-56, delete "of the second fuse" after "region".
Line 56, insert -- first -- before "wide".
Lines 56-57, delete "of the first fuse" after "region".
Line 57, delete "of the second fuse" after "region".
Line 58, insert -- second -- before "narrow".
Line 58, delete "of the second fuse" after "region".

Column 7,
Line 10, delete "and" after "blank;".

Signed and Sealed this

Fifteenth Day of June, 2004

JON W. DUDAS
*Acting Director of the United States Patent and Trademark Office*